(12) United States Patent
Fechser (10) Patent No.: US 7,096,440 B2
(45) Date of Patent: Aug. 22, 2006

(54) METHODS AND SYSTEMS FOR AUTOMATIC VERIFICATION OF SPECIFICATION DOCUMENT TO HARDWARE DESIGN

(75) Inventor: David A. Fechser, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 434 days.

(21) Appl. No.: 10/624,347

(22) Filed: Jul. 22, 2003

(65) Prior Publication Data

US 2005/0022058 A1    Jan. 27, 2005

(51) Int. Cl.
*G06F 9/45* (2006.01)
*G06F 17/50* (2006.01)

(52) U.S. Cl. .......................................................... 716/5
(58) Field of Classification Search .............. 716/1–18; 714/32, 33–36; 713/1, 100
See application file for complete search history.

(56) References Cited

U.S. PATENT DOCUMENTS

| | | | |
|---|---|---|---|
| 5,452,227 A * | 9/1995 | Kelsey et al. .................. 716/3 |
| 5,600,579 A | 2/1997 | Steinmetz, Jr. ............. 364/578 |
| 5,995,736 A * | 11/1999 | Aleksic et al. ................ 716/18 |
| 6,052,524 A * | 4/2000 | Pauna .......................... 703/22 |
| 6,249,899 B1 * | 6/2001 | McBride et al. ............... 716/4 |
| 6,321,365 B1 * | 11/2001 | McBride ......................... 716/5 |
| 6,360,308 B1 | 3/2002 | Fechser ...................... 711/218 |
| 6,405,347 B1 * | 6/2002 | McBride ......................... 716/4 |
| 6,430,652 B1 | 8/2002 | Fechser et al. ............. 711/111 |
| 6,539,523 B1 * | 3/2003 | Narain et al. ................... 716/5 |
| 6,571,375 B1 | 5/2003 | Narain et al. ................... 716/5 |
| 6,718,522 B1 * | 4/2004 | McBride et al. ............... 716/4 |
| 6,990,643 B1 * | 1/2006 | McBride ......................... 716/5 |
| 2004/0030876 A1 * | 2/2004 | Qureshi et al. ................ 713/1 |
| 2004/0216077 A1 * | 10/2004 | Roesner et al. ............... 716/18 |

\* cited by examiner

*Primary Examiner*—Paul Dinh
*Assistant Examiner*—Nghia M. Doan
(74) *Attorney, Agent, or Firm*—Ortiz & Lopez, PLLC (57) ABSTRACT

Methods and systems for automatically verifying a hardware design based on a hardware specification document. Hardware descriptions to be designed according to a hardware specification document are created. A document writer can follow a specified procedure including the use of register mao tables, address map tables and register descriptions to create the hardware descriptions. Flags are embedded in the document which document is then saved for use by internal/external engineers. The used document, which has been saved as a text-only file, is read by a document parsing utility which creates a database of hardware components. Physical components of the hardware device can then be compared with elements maintained within the database upon an initial power-up of the hardware device. RTL auto-generation and software auto-generation modules can be used to ensure that the RTL hardware description complies with the hardware specification.

20 Claims, 4 Drawing Sheets

METHODS AND SYSTEMS FOR AUTOMATIC VERIFICATION OF SPECIFICATION DOCUMENT TO HARDWARE DESIGN

TECHNICAL FIELD

Embodiments generally relate to hardware design verification methods and systems. Embodiments also relate to methods and systems for verifying integrated circuit designs. Embodiments additionally relate to Power On Self Test (POST) techniques and devices.

BACKGROUND OF THE INVENTION

In many instances it can be necessary to implement hardware design verification methods and systems. The objective of design verification is to ensure that errors are absent from a design. Modern integrated circuit (IC) manufacturing technology is enabling IC designers to place millions of transistors on a single IC. Design complexity is doubling every 12–18 months, which causes design verification complexity to increase at an exponential rate. In addition, competitive pressures are putting increased demands on reducing time to market.

Today's design flow begins with a hardware specification document for the design. The engineer then implements the design in a language model, typically a Hardware Description Language (HDL). Such a model can be utilized to discover incorrect input/output (I/O) behavior through a stimulus in expected "results out" paradigm at the top level of the design.

By far the most popular method of functional verification today is simulation-based functional verification, which is widely utilized within the digital design industry as a technique for detecting defects within hardware designs. A very wide variety of products are available in the market to support simulation-based verification methodologies. However, a fundamental problem with conventional simulation-based verification approaches is that they are vector and test bench limited.

Simulation-based verification is driven by a test bench that explicitly generates the vectors to achieve stimulus coverage and also implements the checking mechanism. Test benches create a fundamental bottleneck in simulation-based functional verification. In order to verify a design hierarchy level, a test bench must be generated for it. This creates verification overhead for coding and debugging the test bench. Hence, a significant amount of expensive design and verification engineering resources are needed to produce results in a cumbersome and slow process.

Several methods have been attempted by Electronic Design Automation (EDA) companies today in order to address the shortcomings of simulation. However, none of these attempts address this fundamental limitation of the process. For example, simulation vendors have tried to meet the simulation throughput challenge by increasing the performance of hardware and software simulators thereby allowing designers to process a greater number of vectors in the same amount of simulation time. While this does increase stimulus coverage, the results are incremental. The technology is not keeping pace with the required growth rate and the verification processes are lagging in achieving the required stimulus coverage.

Formal verification is another class of tools that has entered the functional verification arena. These tools rely on mathematical analysis rather than simulation of the design. The strong selling point of formal verification is the fact that the results hold true for all possible input combinations to the design. However, in practice this high level of stimulus coverage has come at the cost of both error coverage and particularly usability. While some formal techniques are available, they are not widely used because they typically require the designer to know the details of how the tool works in order to operate it. Formal verification tools generally fall into two classes: (1) equivalence checking, and (2) model checking.

Equivalence checking is a form of formal verification that provides designers with the ability to perform RTL-to-gate and gate-to-gate comparisons of a design to determine if they are functionally equivalent. Importantly, however, equivalence checking is not a method of functional verification. Rather, equivalence checking merely provides an alternate solution for comparing a design representation to an original golden reference. It does not verify the functionality of the original golden reference for the design. Consequently, the original golden reference must be functionally verified using other methods.

Model checking is a functional verification technology that requires designers to formulate properties about the design's expected behavior. Each property is then checked against an exhaustive set of functional behaviors in the design. The limitation of this approach is that the designer is responsible for exactly specifying the set of properties to be verified. The property specification languages are new and obscure. Usually the technology runs into capacity problems and the designer has to engage with the tools to solve the problems.

There are severe limits on the size of the design and the scope of problems that can be analyzed. For example, the designer does not know which properties are necessary for complete analysis of the design. Further, specifying a large number of properties does not correlate well with better error coverage. Consequently, model checking has proven to be very difficult to use and has not provided much value in the verification process.

In view of the foregoing it would be desirable to create a verification methodology to create high quality designs and to increase the productiveness of design engineers by minimizing the tool setup effort and report processing effort. It is particular desirable to implement a method and system for hardware design verification, which is automatic in nature, and is tied directly to the original hardware design specification at the time of an actual hardware Power On Self Test (POST).

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide improved hardware design verification methods and systems.

It is another aspect of the present invention to provide improved methods and systems for verifying electrical integrated circuit (IC) designs.

It is yet another aspect of the present invention to provide accurate methods and systems for verifying a hardware specification of integrated circuit (IC) designs.

The aforementioned aspects of the invention and other objectives and advantages can now be achieved as described herein. Methods and systems for automatically verifying a hardware design based on a hardware specification document are disclosed herein. A plurality of predefined elements can be designed within a hardware specification document, wherein the hardware specification document provides a hardware design for a hardware device. The plurality of predefined elements can be stored within a database of hardware components, wherein each predefined element of the plurality of predefined elements is associated with a hardware component of the hardware device. Physical components of the hardware device can be compared with the predefined elements maintained within the database of hardware components upon an initial power-up of the hardware device in order to verify that the hardware device functions according to the hardware specification document.

BRIEF DESCRIPTION OF THE DRAWINGS

The accompanying figures, in which like reference numerals refer to identical or functionally-similar elements throughout the separate views and which are incorporated in and form part of the specification, further illustrate embodiments of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
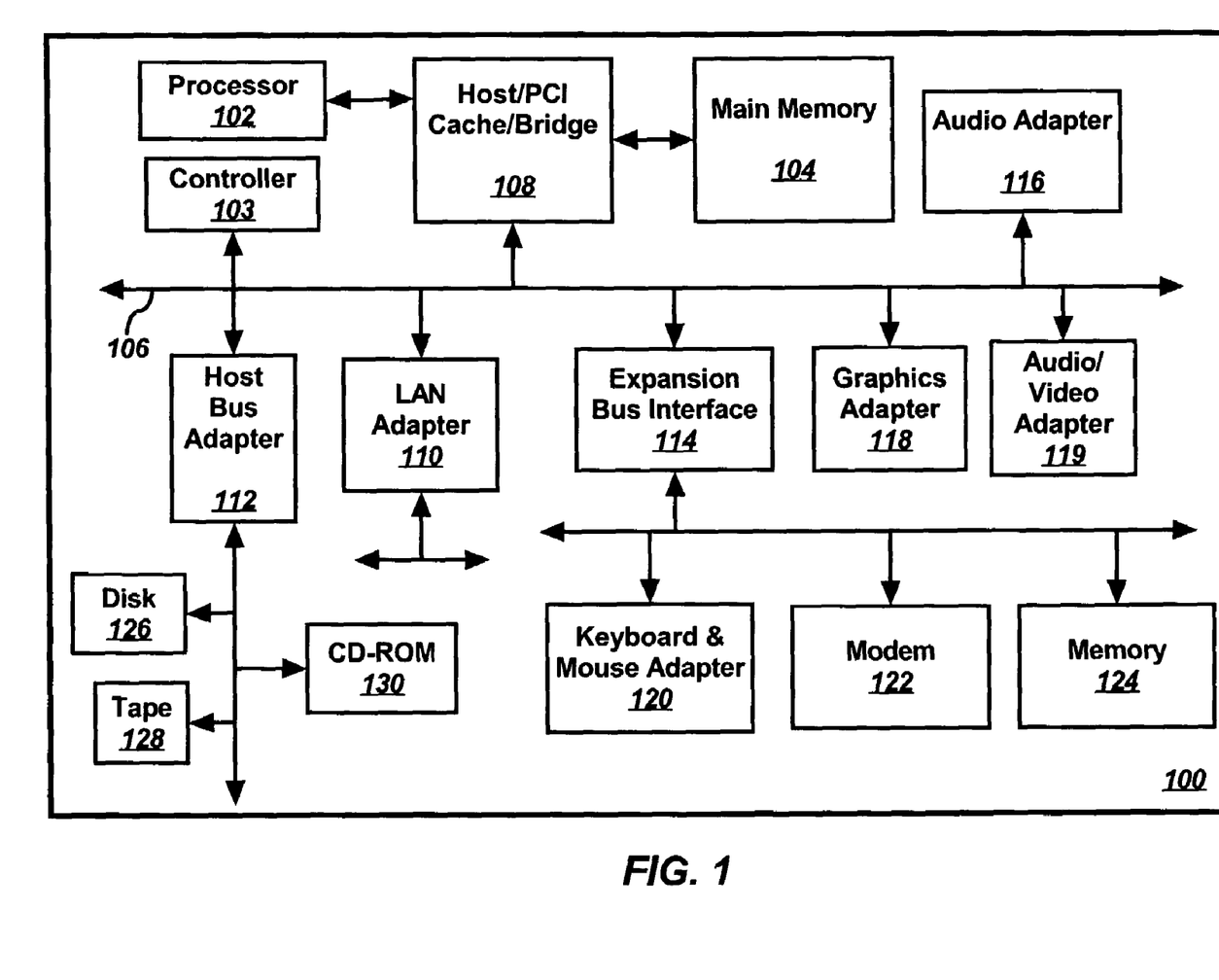
FIG. 1 illustrates a block diagram of a data processing system in which an embodiment of the present invention may be implemented.

With reference now to the figures, and in particular with reference to FIG. 1, a block diagram of a data processing system 100 in which the present invention may be implemented is illustrated. The depicted example is not meant to imply architectural limitations with respect to embodiments of the present invention, but is presented for general illustrative and edification purposes only.

Data processing system 100 can employ a peripheral component interconnect (PCI) local bus architecture. Although the depicted example employs a PCI bus, other bus architectures such as Micro Channel and ISA may be used. A Processor 102 and a main memory 104 can be connected to PCI local bus 106 through PCI bridge 108. PCI bridge 108 also may include an integrated memory controller and cache memory for processor 102. Alternatively, a controller 103 can communicate with PCI local bus 106 to provide additional architectural support. Controller 103 may be utilized in place of to complement an integrated memory controller and cache memory for processor 102.

Additional connections to PCI local bus 106 may be made through direct component interconnection or through add-in boards. In the depicted example, local area network (LAN) adapter 110, host bus adapter 112, and expansion bus interface 114 are connected to PCI local bus 106 by direct component connection. In contrast, audio adapter 116, graphics adapter 118, and audio/video adapter (A/V) 119 are connected to PCI local bus 106 by add-in boards inserted into expansion slots. Expansion bus interface 114 provides a connection for a keyboard and mouse adapter 120, modem 122, and additional memory 124. Host bus adapter 112 provides a connection for hard disk drive 126, tape drive 128, and CD-ROM 130 in the depicted example.

Typical PCI local bus implementations will support three or four PCI expansion slots or add-in connectors. The depicted example includes four loads on the mother board and three expansion slots. Those of ordinary skill in the art will appreciate that the hardware in FIG. 1 may vary. For example, other peripheral devices, such as optical disc drives and the like may be used in addition to or in place of the hardware depicted in FIG. 1.

Figure 2:
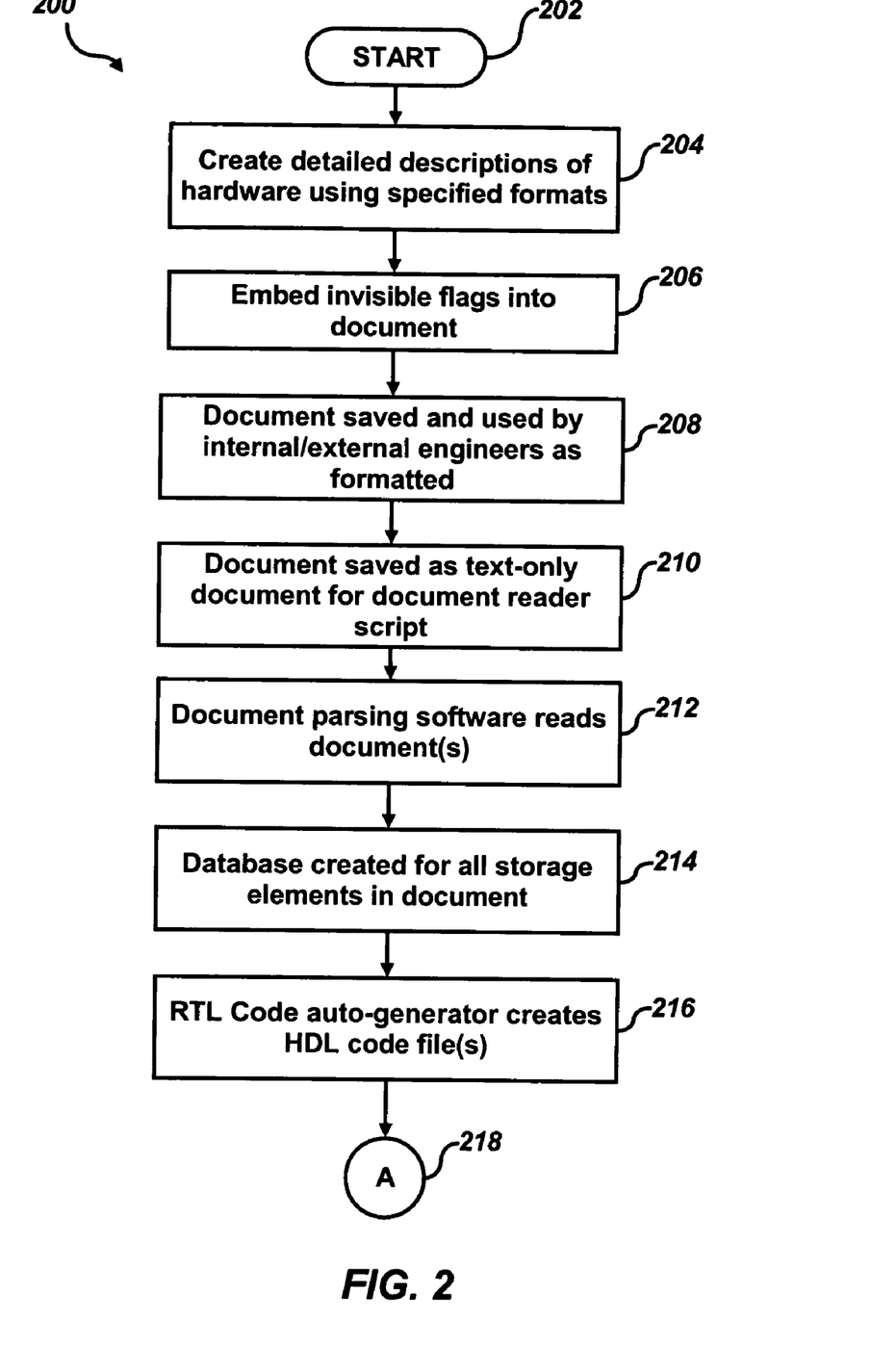
FIG. 2 illustrates a high-level flowchart depicting logical operational steps, which may be followed to implement an embodiment of the present invention.
Figure 3:
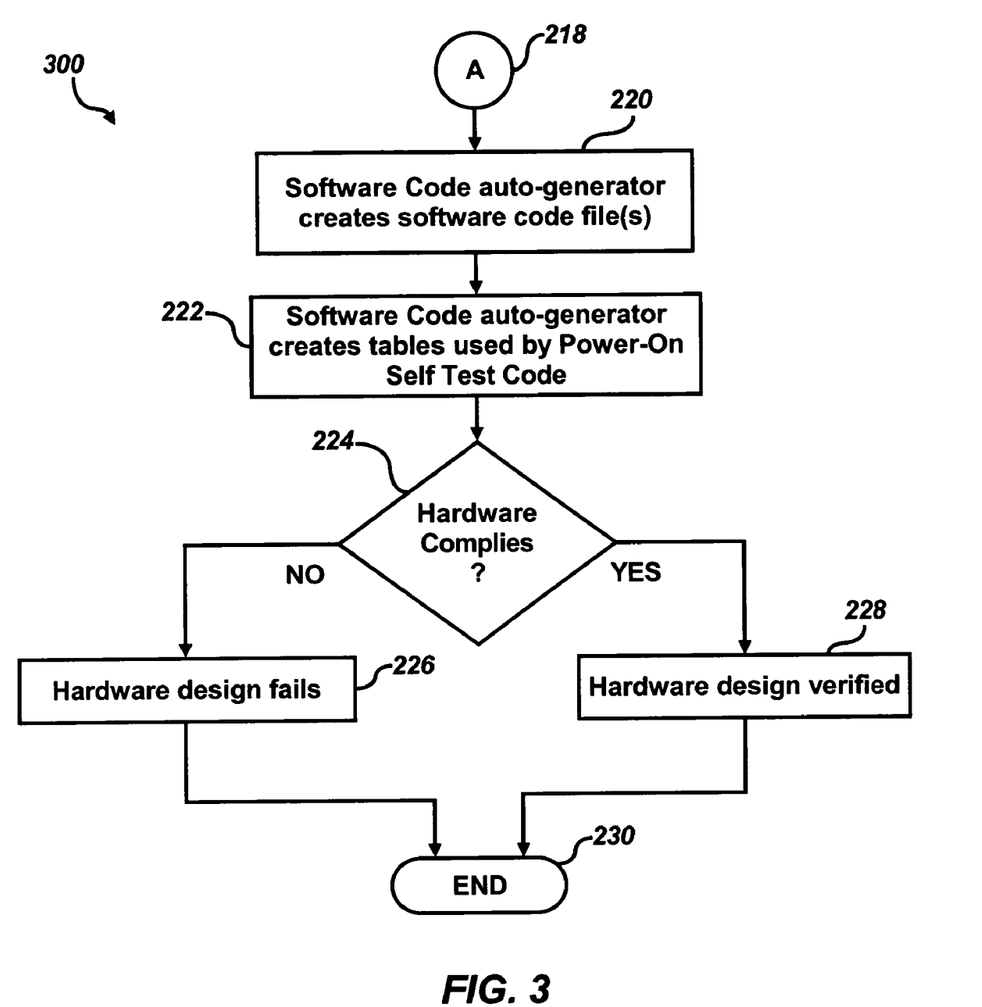
FIG. 3 illustrates a high-level flowchart depicting continuing logical operational steps of the flowchart depicted in FIG. 2, in accordance with an embodiment of the present invention.
Figure 4:
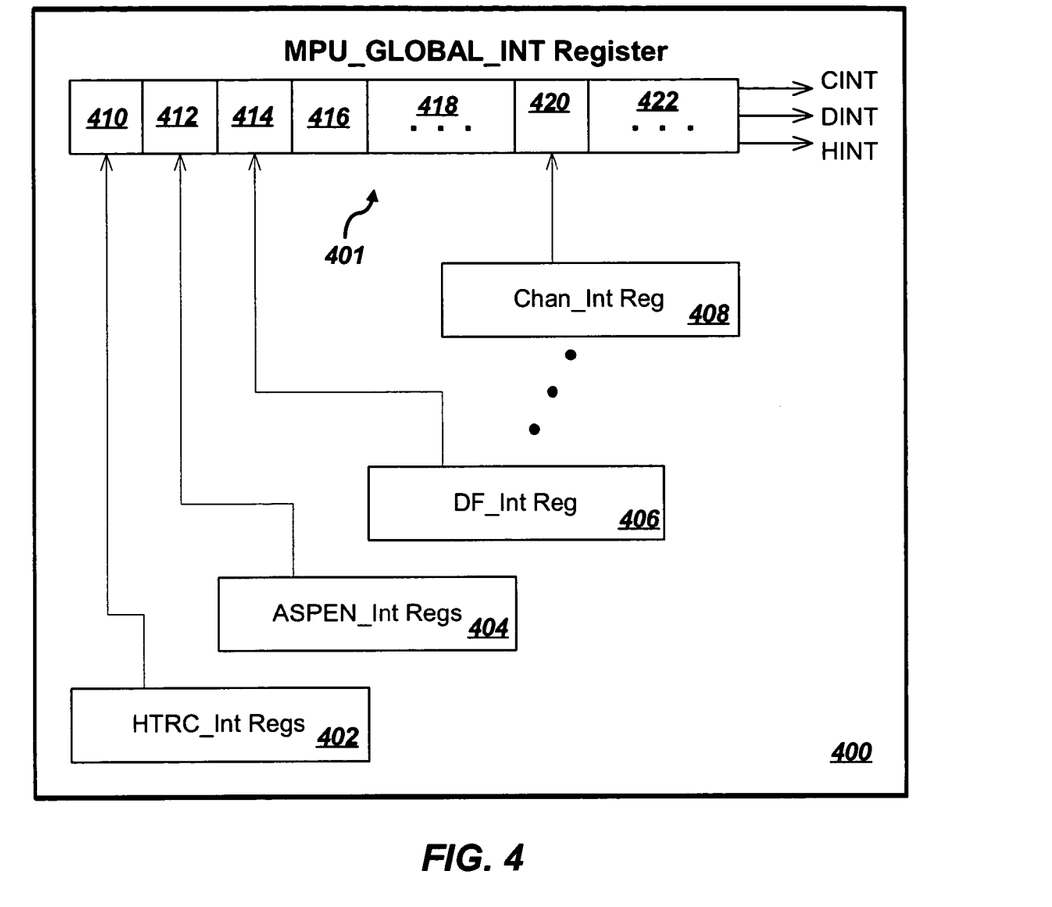
FIG. 4 illustrates a block diagram of a hardware interrupt system, which can be implemented in accordance with an embodiment of the present invention.

Turning now to FIG. 2, a high-level flowchart 200 depicting logical operational steps is illustrated, which may be followed to implement an embodiment of the present invention. FIG. 3 illustrates a high-level flowchart 300 depicting continuing logical operational steps of the flowchart 200 depicted in FIG. 2, in accordance with an embodiment of the present invention. In FIGS. 2 and 3, like parts or elements are indicated by identical reference numerals, such that flowcharts 200 and 300 represent a single continuous flowchart of logical operation steps. FIGS. 2 and 3 together generally illustrate a methodology that includes document parsing software utility, routines, and/or subroutines which search for predefined flags and formatting in a hardware specification document and extracts the hardware information from the hardware specification document.

The document parsing software utility generates a database can be utilized by other utilities. The methodology of FIGS. 2 and 3 can also be utilized to implement an RTL code auto-generation utility that reads the database and creates valid RTL hardware description code that defines the storage elements in the hardware. Additionally, a software code auto-generation utility can be utilized to read the database and create valid software code that defines accesses to the storage elements in the hardware, and which also can generate hardware specification tables, which can be utilized by a Power On Self Test (POST) function, which is described in further detail herein.

Thus, as depicted at block 202, the process is initiated. Thereafter, as illustrated at block 204, a document writer can follow a specified procedure to created detailed descriptions of the hardware to be designed according to the hardware specification document. Such specified procedure includes the use of specified formats for register map tables, address map tables and register description sections of the hardware specification document. Next, as described at block 206, invisible flags are embedded in the document to be utilized by the document reader script, which will be described in more detail herein. Thereafter, as depicted at block 208, the document can be saved and used by internal and external engineers as formatted. Next, as illustrated at block 210, the document can be saved as a text-only document for use by the document reader script.

Thereafter, as illustrated at block 212, a document parsing software utility reads the document(s), and creates, as depicted at block 214, a database of all storage elements in the document that are visible to a microcontroller, such as, for example, controller 103 of data processing system 100 illustrated in FIG. 1. Next, as depicted at block 216, an RTL code auto-generator can be utilized to create HDL code file(s). The acronym "HDL" generally refers to "Hardware Description Language". The process continues, as indicated at continuation block 218 in FIGS. 2 and 3.

As illustrated thereafter at block 220 of FIG. 3, the software code auto-generator can create software file(s) that contain definitions and declarations for every storage element and for every bit field within registers, strictly as defined in the hardware document specification. Next, as indicated at block 222, the software code auto-generator can create tables utilized by Power-On Self Test Code to check the hardware upon power-up. The use of the auto-generated software code ensures that the RTL hardware description complies with the hardware specification document.

In accordance with one embodiment of the present invention, two code auto-generators can be implemented, including the hardware RTL code generator and the software code generator. Block 216, for example, refers to hardware code. Blocks 220–222, on the other hand, refer to software code which is not RTL code. In accordance with one possible embodiment of the present invention, such code may be C or C++ code. It can of course be appreciated by those skilled in the art that C or C++ code is not considered a limiting feature of the present invention, because other types of programming code can also be utilized to implement embodiments.

The use of the auto-generated software code for storage elements and the Power-On Self Test tables causes the software to fail if the hardware does not comply with the specification document. Thus, as depicted at block 224, a test can be performed to determine if the hardware complies with the specification document. If so, then the hardware design is verified, as indicated at block 228. If not, then the hardware design fails, as indicated at block 226. The process then terminates, as depicted at block 230.

When implementing a method and/or system for verifying hardware designs against a hardware specification document, files can be organized according to a layered structured. Such a layered structure can be implemented as firmware and may include hardware drivers, which are based on code that actually manipulates hardware register bits or memory. These drivers can be contained in the context of one or more files that hold only code that affects the specific hardware in question. A hardware driver generally is composed of both initialization code, and the actual driver code. The layered structure can also include configuration code that loads data and then acts as a ROM (read only memory) for the remainder of the firmware operations.

Additionally, such a layer structure can include definitions that are specific to an external standard, such as, for example, the SAS or SCSI bus standards. These definitions can be contained in header files that hold definitions specific to that standard. The layered structure can also include operating system header and code files that exist to contain definitions and declarations utilized by a kernel to control the general flow of the software. These include all general code files that contain common definitions and declarations. Additionally, the layer structure can include development code files are files that contain code utilized for debugging. Code that facilitates retargettable Output for tracing or any other functions that are not part of the actual firmware can be contained within such code files.

In accordance with an embodiment of the present invention, the interface for each separately specified block of hardware can be contained within its own code file set. The intent of this action is to provide a hardware abstraction layer so that if any part of the hardware is upgraded or redesigned in a later generation of the chip, code changes are limited to only the files owning that hardware interface.

The files can contain the following: <HW Block Name>.h. This file contains the interface between the hardware and the rest of the firmware. Such a file can include prototypes for any functions that are owned by the hardware interface and that are visible to other parts of the firmware (e.g., a driver API). This also includes 'extern' declarations for any constants that are owned by this hardware interface but that must be visible elsewhere.

The files can also contain <HW Block Name>.c. This file contains the code that directly manipulates the hardware. This includes declarations for all private functions, variables, block-owned registers, and constants. This also includes definitions for all public functions and for constants declared 'extern' in the .h file.

TABLE 1

Hardware Driver Files

| Hardware Block | Code File | Header File |
| --- | --- | --- |
| Ouray Register Definitions | <none> | OurayNN_reg.h |
| Saspen Protocol Engine Register Definitions | <none> | Saspen_NN_reg.h |
| Buffer Controller | bc.c | bc.h |
| Microprocessor Interface | mpu.c | mpu.h |
| RAM Test | rtest.c | rtest.h |
| Saspen Sub-Blocks | | |
| Saspen Command Buffer | cbuf.c | cbuf.h |
| Saspen Data Buffer | dbuf.c | dbuf.h |
| Saspen Frame Buffer | fbuf.c | fbuf.h |
| Saspen Global | saspen.c | saspen.h |
| Saspen Header Buffer | hbuf.c | hbuf.h |
| Saspen Receive Data Path | dpt.c | dpt.h |
| Saspen RX WCS | rxwcs.c | rxwcs.h |
| Saspen Transmit Buffer | txb.c | txb.h |
| Saspen Transmit Data Path | txdp.c | txdp.h |
| Saspen Transmit Request | txreq.c | txreq.h |
| Saspen TX WCS | txwcs.c | txwcs.h |
| Host Sub-Blocks | | |
| Command Automation Processor | cap.c | cap.h |
| Command FIFO | cfifo.c | cfifo.h |
| Context Cache | cc.c | cc.h |
| Disk Thread Retrieval Channel | dtrc.c | dtrc.h |
| Free Pointer Manager | fpm.c | fpm.h |
| Host Global | host.c | host.h |
| Host Thread Retrieval Channels | htrc.c | htrc.h |
| Pending Write Table | pwt.c | pwt.h |
| Prefetch Engine | peng.c | peng.h |
| Read Context Manager | rcm.c | rcm.h |
| Read DMA | rdma.c | rdma.h |
| Receive Frame Router | rxfr.c | rxfr.h |
| Status Context Manager | scm.c | scm.h |
| Status Thread Retrieval Channel | strc.c | strc.h |
| Tag Manager | tag.c | tag.h |
| Transfer Control FIFO | tcfifo.c | tcfifo.h |
| Write Context Manager | wcm.c | wcm.h |
| Write DMA | wdma.c | wdma.h |
| Disk Formatter Sub-Blocks | | |
| Data Channel | dchan.c | dchan.h |
| Data Path | dp.c | dp.h |
| Disk Formatter Global | df.c | df.h |
| Disk Formatter Writeable Control Store | wcs.c | wcs.h |
| Error Correction Engine | ecc.c | ecc.h |
| Release Control | rel.c | rel.h |
| RG/WG Sequencer | rgwg.c | rgwg.h |
| Sector Generation | sec.c | sec.h |
| Servo Positioning Table | spt.c | spt.h |
| Skip Mask Table | smt.c | smt.h |
| Start Of Sector | sos.c | sos.h |
| Transfer Control Table | tct.c | tct.h |

In accordance with an embodiment, code architecture can be implemented to include an infinite loop, event handlers, and interrupt handlers. The kernel code which implements the architecture can be contained in the main.c and global.c/h files. This includes event handling code and various other general utilities that are used by other code but are not hardware-specific.

A Power On Self Test (POST) can be implemented in accordance with embodiments of the present invention and may possess special capabilities due to a UNIX executable aspect of the compiled code that would not be available if this were truly loadable firmware. A number of data structures can be used in the POST, including a Register Block Space Table, which comprises an Array storing the size of the address space for each register block. Such a table can be utilized to test the reserved spaces for unspecified storage elements. Registered addresses can be also utilized in the POST as a list of number defined literals utilized in other tables. A "Go Mask Table" can also be utilized with the post, which comprises an array that contains an entry for every register that contains a GO bit.

Each entry will contain the address of the register and a mask with zeroed bits where GO bits exist. Go bits are specified in the hardware specifications by the letters "Go" at the end of the bit name. Additional data structures include a Power-On Reset Value Table (POR VTable) and a "Write Bits table." A POR VTable can be implemented as an array organized by register within register block. Each entry contains the register's address, the POR specification for the register, and a mask value that contains zeroed bits wherever the hardware specification indicates that the POR value is unknown. A "Write Bits Table" can be configured as an array organized by register within register block. Each entry can contain the register's address and a mask value that contains zeroed bits wherever the hardware specification indicates that a non-writeable bit exists. A writeable bit can be defined as a bit that reads back what was written.

An "On Chip RAM Information Table" can also be utilized with the POST in the form of an array for storing a word size (in 32-bit unsigned long values), number of words, and a mask for each entry in each on-chip RAM. The mask can include two unsigned long values with zeroed bits where no storage exists. Such a format can be utilized to determine the actual width of an entry in the RAM when the RAM has a non-DWORD word width. An internal buffer, for example, can be 34 bits wide, and is therefore listed as possessing 2 32-bit entries per word. The MS mask can be set, however, to 0x00000003 to indicate that only two bits in the MS 32-bit entry are real.

In general, the top level POST program simply calls the CPU initialization program and then calls for a POST. The POST can verify the functionality of the hardware in the following order: 1. Test Power-On Reset (POR) values of registers; 2. Test Write/Read capabilities of registers; 3. Test Interrupts; 4. Test On Chip Memory; 5. Test Off-Chip Memory; and 6. Run any automated tests existing in the hardware design (i.e., referred to here as an RTEST).

In order to handle exceptions to the standard write-then-read verification test, and in order to allow the skipping of this test on bits where toggling would be a critical error, such as "Go" bits, the "GoBitTable" can be utilized. The POST will also test reserved register locations. Ideally these would read back zero and would not return what is written. For each address location in each register block, the following algorithm can be followed:

1. If the location exists in the Avoid table then skip it and continue to the next location.
2. Set the Go mask to 0xFFFFFFFF.
3. If the location contains a register then get the WriteBits mask from the Write Bits Table.
4. Else set the Write Bits mask to 0xFFFFFFFF.
5. If the location is in the Go Mask table then get the Go mask value.
6. If the Write Bits mask is zero then continue to the next location.
7. Read the register's current value.
8. XOR the read value with the Write Bits mask; AND the results with the Go mask.
9. Write to the register.
10. Read the register, AND this value with the Write Bits and Go mask.
11. Check the masked read value with the masked write value.
12. If the values do not match then FAIL to log file.
13. If the read value is non-zero and no register exists then FAIL to log file.

An interrupt verification function can be implemented in accordance with an embodiment, which masks and clears all interrupts and sets the interrupt polarity to high. The interrupt verification function can then register an interrupt handler (IntISR( )) function with the compiler, call a function (PostTriggerInt( )) to force each interrupt, and then reregister the "real" ISRs for actual firmware operation. The PostTriggerInt( ) function may cause an interrupt by setting up a "watch dog" timer interrupt to trigger an interrupt signal. The IntISR( ) function sets a flag to show which interrupt occurred and then masks and clears the processor's interrupt logic.

An On-Chip Memory Verification can be implemented as a function that can test the on-chip memories specified in the hardware specification. The On-Chip Memory Verification function can cycle through each on-chip memory and performs the following several tests, including writing incrementing or decrementing byte values to every location, then read back and verify. Other tests include, for example, writing 0xAAAAAAAA to every location, and then reading back and verifying. Another test can include writing 0x55555555 to every location, then read back and verify. In the first three tests the memory location directly below and above the indicated memory block space is also written and read to verify that it does NOT contain valid memory.

An on-chip memory verification function can be utilized to write or read a single on-chip memory location. Such a function when reading compares the value with the expected value (i.e., a parameter). This returns a FAIL message or command if the address is valid. The read value does not compare, however, if the address is invalid. The case, the data is compared.

The Off-Chip Memory Verification function can perform a particular number of operations. First Off-Chip Memory locations in the window can be written, as specified by auto-generated write test table entries. Second, the Off-Chip Memory values can be read and compared using the configurations designed according to step one above. Crosstalk in the off-chip data lines can be checked with an operation that performs a write of traveling 1's to the off-chip memory starting at location zero. Finally, the off-chip memory values can be read and compared to the off-chip memory values written via step 3 listed above.

Hardware auto-test (RTEST) logic can be implemented as hardware designed specifically to test a hardware block automatically. The RTEST portion of the POST simply sets up the RTEST logic and then starts the hardware test. The POST code handles any interrupts generated by the RTEST logic. Any of the aforementioned tests may generate POST warnings or failures. Warnings will not stop the POST, but can cause the POST to return a nonzero value. Errors can halt the POST function and cause the firmware to trap.

Based on the foregoing, it can be appreciated that embodiments of the present invention, as disclosed herein, are directed toward methods and systems for verifying a hardware specification of integrated circuit (IC) designs. Embodiments also include methods and systems for automatically verifying a hardware design based on a hardware specification document. As indicated herein, a plurality of predefined elements can be designed within a hardware specification document, such that the hardware specification document provides a hardware design for a hardware device.

The predefined elements can be stored within a database of hardware components, wherein each predefined element of the predefined elements is associated with a hardware component of the hardware device. Physical components of the hardware device can be compared with the predefined elements maintained within the database of hardware components upon an initial power-up of the hardware device in order to verify that the hardware device functions according to the hardware specification document.

An RTL auto-generation utility or module generally auto-generates define statements utilized by the RTL code to decode and configure the hardware memories and registers. The software auto-generation utility or module auto-generates the same define statements utilized by the software code. The POST software auto-generation utility or module, as indicated earlier, can then auto-generate table-based tests that can verify the accessibility and correctness of the on-chip memories, off-chip memories, and registers as specified in the IC specification document.

Note that embodiments of the present invention can be implemented in the context of a "module" or "modules". In the computer programming arts, for example, a module can be typically implemented as a collection of routines and data structures that performs particular tasks or implements a particular abstract data type. Modules can be composed of two parts. First, a software module may list the constants, data types, variable, routines and the like that can be accessed by other modules or routines. Second, a software module can be configured as an implementation, which can be private (i.e., accessible perhaps only to the module), and that contains the source code that actually implements the routines or subroutines upon which the module is based. Thus, for example, the term module, as utilized herein can refer to a software module(s) or implementations thereof. Such modules can be utilized separately or together to form a program product that can be implemented through signal-bearing media, including transmission media and recordable media.

Examples of suitable modules which can be implemented in accordance with embodiments of the present invention include a comparing module, a testing module, an RTL auto-generation module, a software auto-generation module, and the like. The comparing module, for example, can automatically compare physical components of the hardware device with the predefined elements maintained within the database of hardware components upon an initial power-up of the hardware device, in order to verify that the hardware device functions according to the hardware specification document.

The testing module, for example, can automatically force the hardware device to fail if the hardware device does not comply with the hardware specification document, in response to automatically comparing physical components of the hardware device with the predefined elements maintained within the database of the hardware components upon an initial power-up of the hardware device. The RTL auto-generation module can generate define statements utilized by an RTL code to decode and configure at least one hardware memory and at least one register thereof. The software auto-generation module can auto-generate the same set of define statements utilized by the software code thereof.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The invention claimed is:

1. A method for automatically verifying a hardware design based on a hardware specification document, said method comprising the steps of:

designating a plurality of predefined elements within a hardware specification document, wherein said hardware specification document provides a hardware design for a hardware device;

storing said plurality of predefined elements within a database of hardware components, wherein each predefined element of said plurality of predefined elements is associated with a hardware component of said hardware device;

embedding said plurality of predefined elements within said hardware specification document preparatory to storing said predefined elements in said database, wherein said plurality of predefined element comprise flags which can be utilized by a document reader script;

creating at least one RTL Hardware Description code file from said database, said RTL Hardware description code file(s) defining said predefined elements stored in said database; and automatically comparing physical components of said hardware device with said predefined elements maintained within said database of said hardware components upon an initial power-up of said hardware device, in order to verify that said hardware device functions according to said hardware specification document.

2. The method of claim 1 further comprising the step of:

configuring said hardware specification document to include a specified format which is readable by a document parsing utility for storing said plurality of predefined elements in said database, wherein said specified format includes at least one of the following sections: register map tables, address map tables, and register descriptions.

3. The method of claim 1 further comprising the step of:
saving said document including said embedded plurality of predefined elements for use by Internal/external engineers as formatted preparatory to storing said plurality of predefined elements in said database.

4. The method of claim 3 further comprising the method steps of:
using said saved document as formatted; and
saving said used document to a text-only document which can be utilized said document reader script.

5. The method of claim 4 wherein storing said plurality of predefined elements in said database of hardware components comprises reading said saved document using a document parsing utility.

6. The method of claim 1 further comprising the step of:
dynamically creating a plurality of tables for utilization by a POST to verifying said hardware device upon a power up of said hardware device.

7. The method of claim 1 further comprising the step of:
automatically forcing said hardware device to fail if said hardware device does not comply with said hardware specification document, in response to automatically comparing physical components of said hardware device with said predefined elements maintained within said database of said hardware components upon an initial power-up of said hardware device.

8. A system for automatically verifying a hardware design based on a hardware specification document, said system comprising:
a plurality of predefined elements designated within a hardware specification document, wherein said hardware specification document provides a hardware design for a hardware device;
a database of hardware components for storing said plurality of predefined elements, wherein each predefined element of said plurality of predefined elements is associated with a hardware component of said hardware device;
wherein said plurality of predefined elements are embedded within said hardware specification document preparatory to storing said predefined elements in said database, wherein said plurality of predefined elements comprise flags which can be utilized by a document readerscript;
an RTL auto-generation module for creating at least one RTL Hardware description code from said database, said RTL Hardware description code file(s) defining said predefined elements stored in said database; and
a comparing module for automatically comparing physical components of said hardware device with said predefined elements maintained within said database of said hardware components upon an initial power-up of said hardware device, in order to verify that said hardware device functions according to said hardware specification document.

9. The system of claim 8 further comprising a document parsing utility for storing said plurality of predefined elements in said database.

10. The system of claim 9 wherein said hardware specification document comprises a specified format which is readable by said document parsing utility, wherein said specified format includes at least one of the following sections: register map tables, address map tables, and register descriptions.

11. The system of claim 8 wherein said document including said embedded plurality of predefined elements comprises a saved document for use by internal/external engineers as formatted preparatory to storing said predefined elements in said database.

12. The system of claim 11 wherein said used document is saved as a text-only document which can be utilized by said document reader script.

13. The system of claim 12 wherein said database of hardware components comprises a database of storage elements visible to a microcontroller and further comprising a plurality of files automatically generated, which contain definitions and declarations for said storage elements and for every bit field within registers thereof.

14. The system of claim 8 further comprising a plurality of tables dynamically created for utilization by a POST to verifying said hardware device upon a power up of said hardware device.

15. The system of claim 8 further comprising a testing module for automatically forcing said hardware device to fail if said hardware device does not comply with said hardware specification document, in response to automatically comparing physical components of said hardware device with said predefined elements maintained within said database of said hardware components upon an initial power-up of said hardware device.

16. The system of claim 8 wherein said RTL auto-generation module comprises an RTL auto-generation utility for generating define statements utilized by an RTL code to decode and configure at least one hardware memory and at least one register thereof.

17. The system of claim 8 further comprising a software auto-generation utility that auto-generates a same set of define statements utilized by a software code thereof.

18. A system for automatically verifying a hardware design based on a hardware specification document, said system comprising:
a plurality of predefined elements designated within a hardware specification document, wherein said hardware specification document provides a hardware design for a hardware device;
a database of hardware components for storing said plurality of predefined elements, wherein each predefined element of said plurality of predefined elements is associated with a hardware component of said hardware device;
a document parsing utility storing said plurality of predefined elements in said database, wherein said hardware specification document comprises a specified format which is readable by said document parsing utility, wherein said specified format includes at least one of the following sections: register map tables, address map tables, and register descriptions;
an RTL auto-generation module for creating at least one RTL Hardware description code from said database, said RTL Hardware description code file(s) defining said predefined elements stored in said database;
a comparing module for automatically comparing physical components of said hardware device with said predefined elements maintained within said database of said hardware components upon an initial power-up of said hardware device, in order to verify that said hardware device functions according to said hardware specification document; and wherein said plurality of predefined elements are embedded within said hardware specification document preparatory to storing said plurality of predefined elements in said database, such that said plurality of predefined elements comprise invisible flags which can be utilized by a document reader script.

19. The system of claim 18 further comprising:

a plurality of tables dynamically created for utilization by a POST to verifying said hardware device upon a power up of said hardware device; and a testing module for automatically forcing said hardware device to fail if said hardware device does not comply with said hardware specification document, in response to automatically comparing physical components of said hardware device with said predefined elements maintained within said database of said hardware components upon an initial power-up of said hardware device.

20. The system of claim 18 wherein said RTL auto-generation module is arranged for generating define statements utilized by an RTL code to decode and configure at least one hardware memory and at least one register thereof; and further comprising a software auto-generation module that auto-generates a same set of define statements utilized by a software code thereof.

* * * * *